US009671226B2

(12) United States Patent
Morrison et al.

(10) Patent No.: US 9,671,226 B2
(45) Date of Patent: Jun. 6, 2017

(54) MAGNETIC SENSOR CALIBRATION FOR AIRCRAFT

(71) Applicant: Honeywell International Inc., Morristown, NJ (US)

(72) Inventors: John R. Morrison, Minneapolis, MN (US); Vibhor L. Bageshwar, Minneapolis, MN (US); Ruth Dagmar Kreichauf, River Falls, WI (US); Zdenek Kana, Dubnany (CZ)

(73) Assignee: Honeywell International Inc., Morris Plains, NJ (US)

( * ) Notice: Subject to any disclaimer, the term of this patent is extended or adjusted under 35 U.S.C. 154(b) by 112 days.

(21) Appl. No.: 14/573,657

(22) Filed: Dec. 17, 2014

(65) Prior Publication Data
US 2016/0178371 A1 Jun. 23, 2016

(51) Int. Cl.
*G01C 17/38* (2006.01)
*G01R 33/00* (2006.01)

(52) U.S. Cl.
CPC ......... *G01C 17/38* (2013.01); *G01R 33/0035* (2013.01)

(58) Field of Classification Search
CPC ............................ G01R 33/0035; G01C 17/38
See application file for complete search history.

(56) References Cited

U.S. PATENT DOCUMENTS

| 6,860,023 | B2 | 3/2005 | Manfred et al. |
| 7,451,549 | B1 | 11/2008 | Sodhi et al. |
| 8,825,426 | B2 | 9/2014 | Chowdhary et al. |

(Continued)

FOREIGN PATENT DOCUMENTS

| EP | 2447667 | 5/2012 |
| EP | 2669625 | 12/2013 |
| WO | 2014134710 | 9/2014 |

OTHER PUBLICATIONS

Elgersma et al., "System and Method for Magnetometer Calibration and Compensation", U.S. Appl. No. 13/942,167, filed Jul. 15, 2013, pp. 1-37, Published in: US.

(Continued)

*Primary Examiner* — Patrick Assouad
*Assistant Examiner* — Haidong Zhang
(74) *Attorney, Agent, or Firm* — Fogg & Powers LLC

(57) ABSTRACT

A method of magnetic sensor calibration for aircraft comprises obtaining attitude data, heading angle data, position data, and date information; inputting the position data and date into an earth magnetic field (EMF) model and into an EMF model correction map; inputting the attitude and heading angle data into a NOLL to body frame transformation module; outputting an EMF model vector from the EMF model; outputting an EMF correction vector from the EMF model correction map; compensating the EMF model vector with the EMF correction vector to produce a corrected EMF model vector; inputting the corrected EMF model vector into the transformation module; inputting magnetic field measurements data into a calibration processing unit; inputting true earth magnetic field data from the transformation module into the processing unit; computing compensation coefficients in the processing unit based on the magnetic field measurements and the true earth magnetic field; and storing the compensation coefficients.

20 Claims, 2 Drawing Sheets

(56) References Cited

U.S. PATENT DOCUMENTS

| | | | | |
|---|---|---|---|---|
| 2004/0123474 | A1* | 7/2004 | Manfred | G01C 17/38 |
| | | | | 33/352 |
| 2005/0125141 | A1* | 6/2005 | Bye | G01S 19/47 |
| | | | | 701/469 |
| 2007/0032974 | A1 | 2/2007 | Muniraju et al. | |

OTHER PUBLICATIONS

Wahdan et al., "Magnetometer Calibration for Portable Navigation Devices in Vehicles Using a Fast and Autonomous Technique", "IEEE Transactions on Intelligent Transportation Systems", Oct. 2014, pp. 2347-2352, vol. 15, No. 5, Publisher: IEEE, Published in: US.

European Patent Office, "Extended European Search Report from EP Application No. 15199405.0 mailed May 2, 2016", from Foreign Counterpart of U.S. Appl. No. 14/573,657, filed May 2, 2016, pp. 1-12, Published in: EP.

European Patent Office, "Results of consultation, from EP Application No. 15199405.0, mailed Oct. 28, 2016", from Foreign counterpart of U.S. Appl. No. 14/573,657, filed Oct. 28, 2016, pp. 1-3, Published in: EP.

European Patent Office, "Communication pursuant to Article 94(3) EPC, from EP Application No. 15199405.0, mailed Nov. 4, 2016", from Foreign Counterpart of U.S. Appl. No. 14/573,657, filed Nov. 4, 2016, pp. 1-10, Published in: EP.

* cited by examiner

MAGNETIC SENSOR CALIBRATION FOR AIRCRAFT

BACKGROUND

Heading angle is a critical parameter for an aircraft. An Attitude and Heading Reference System (AHRS) typically calculates magnetic heading angle from measurements of earth's magnetic field taken from a magnetometer. The magnetometer is subject to measurement errors generated from the aircraft such as hard iron bias and soft iron, and measurement errors generated from the sensor such as scale factor and misalignment that corrupt the measurements and make it difficult to directly measure the earth's magnetic field. Hard iron bias refers to the effect of permanently magnetized material that introduces a bias to earth's magnetic field at the magnetometer location. Soft iron refers to material that is not permanently magnetized but distorts the earth's magnetic field at the magnetometer location. The effects of the magnetometer measurement errors can result in magnetic heading angle errors of 10 degrees or more.

Magnetic calibration is used to correct for the effects of magnetometer measurement errors so that magnetic heading angle can be determined accurately. Traditional compass rose magnetic calibration is done on the ground through the use of surveyed heading angles, which are compared to the AHRS magnetic heading angle. However, there are certain costs and risks that can be eliminated by replacing on-ground calibration with in-air magnetic calibration. These include the need for dedicated compass rose facilities; the time and cost for a tug vehicle and operator to rotate the aircraft; the cost of safety personnel around the aircraft when engines are running; the risk of an incorrect calibration due to magnetic interference from ground equipment; and the limitation of two dimensional magnetometer calibration.

In-air magnetic calibration addresses the foregoing problems and provides a full three dimensional magnetometer calibration with a brief one-time flight maneuver. However, in-air calibration still requires a true heading angle input. In one prior approach, the source of true heading angle for use in-air calibration was an inertial reference system (IRS). The need for an IRS on the aircraft made this approach limited, as the IRS may not be available in the aircraft architecture.

SUMMARY

A method of magnetic sensor calibration for an aircraft comprises obtaining attitude data, heading angle data, position data, and date information for the aircraft; inputting the position data and the date information into an earth magnetic field model; inputting the position data and the date information into an earth magnetic field model correction map; inputting the attitude data and the heading angle data into a North Oriented Local Level (NOLL) to body frame transformation module; outputting an earth magnetic field model vector from the earth magnetic field model; outputting an earth magnetic field model correction vector from the earth magnetic field model correction map; compensating the earth magnetic field model vector with the earth magnetic field model correction vector to produce a corrected earth magnetic field model vector; inputting the corrected earth magnetic field model vector into the NOLL to body frame transformation module; inputting magnetic field measurements data into a calibration processing unit; inputting true earth magnetic field data from the NOLL to body frame transformation module into the calibration processing unit; computing compensation coefficients in the calibration processing unit based on the magnetic field measurements data and the true earth magnetic field data; and storing the compensation coefficients in a memory unit.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

Figure 1:
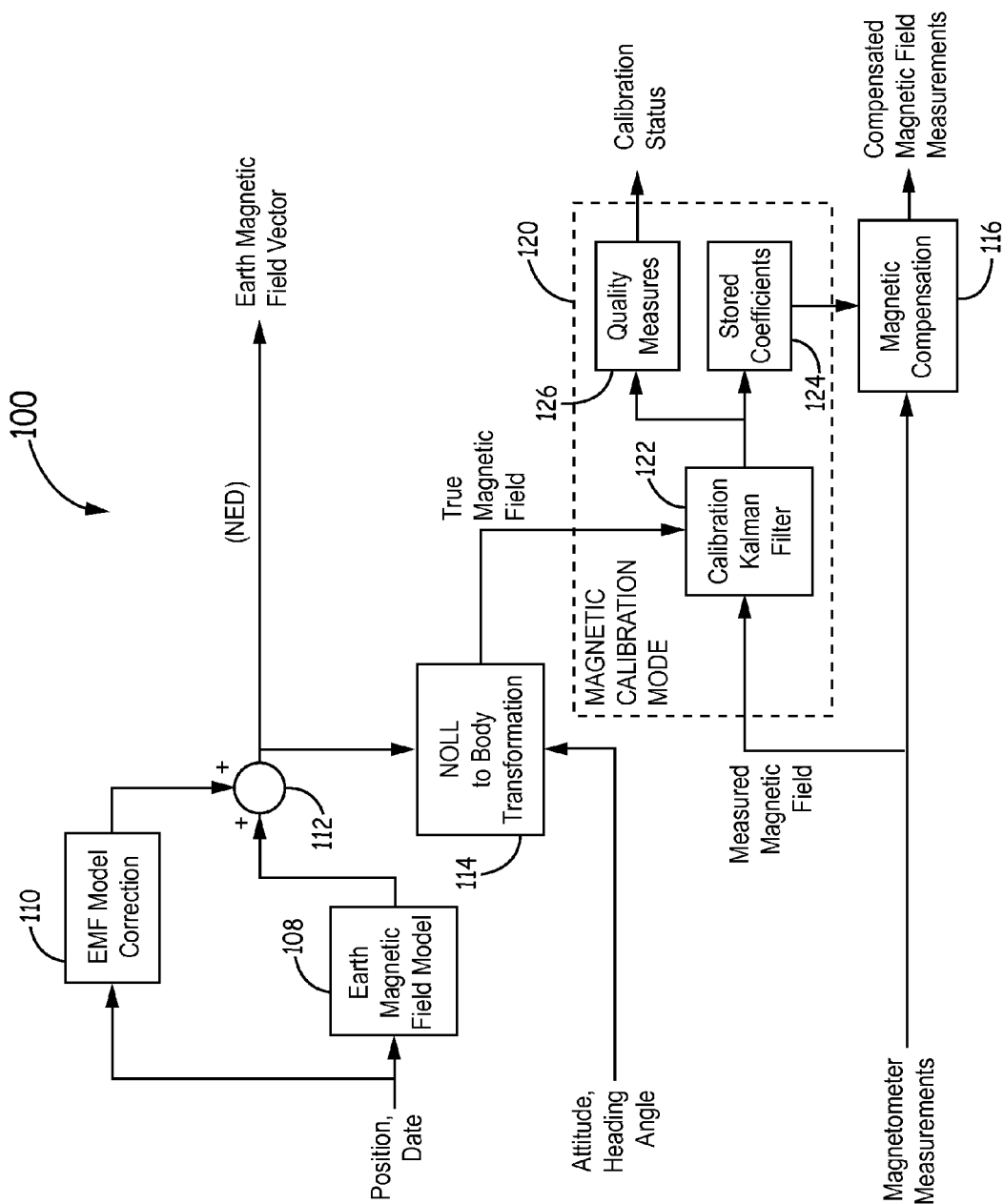
FIG. 1 is a functional block diagram of a magnetometer calibration system according to one embodiment.

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense A magnetic calibration system and method for aircraft are provided. The magnetic calibration determines a set of compensation coefficients that are used in real time operation to compensate magnetometer measurements for the effects of aircraft and internal magnetometer error sources which result in magnetometer measurement errors in the aircraft.

In one approach, a method for accomplishing an in-air magnetic calibration using a Global Positioning System (GPS) Attitude and Heading Reference System (GPAHRS) and aircraft maneuvers is provided, which does not depend on an inertial reference system (IRS). This approach accomplishes in-air magnetic calibration with a GPAHRS solution, which is able to provide true attitude and heading angle under conditions of a selected aircraft maneuver.

In another approach, a method for in-air magnetic calibration employs an Attitude and Heading Reference System (AHRS) and pilot entry. In other approaches, the present methods for magnetic calibration can be carried out with an IRS or an inertial measurement unit (IMU) when one is available.

The above approaches also include a brief one-time flight maneuver, which enables the magnetometer to be rotated in three dimensions relative to the local earth magnetic field. This allows for in-air magnetic recalibration anywhere for maintenance purposes. Alternatively, an on-ground compass rose rotation maneuver can be performed.

The magnetic calibration process includes gathering magnetometer data along with position, attitude, and heading angle data such as GPAHRS data (or GPAHRS and inertial measurement data when available) during in-flight or on-ground maneuvers, and calculating compensation coefficients based on all the measurement data. The compensation coefficients are permanently stored onboard the aircraft for use on all future flights. The process of determining magnetic calibration coefficients can be accomplished in software. Once magnetic calibration has been performed, the magnetometer measurements are compensated for the effects of measurement errors on all future flights.

In the present approach, a discrete-time calibration is performed that is assumed to be valid for a period of time.

In addition, suitable maneuvers are defined to induce accelerations that enable a single antenna GPS to provide heading angle. The calibration algorithms are updated to incorporate fluctuations between the true earth magnetic field and an earth magnetic field model.

The present method determines whether calibration parameters can be computed from a maneuver, and determines whether calibration parameters require an update. Calibration parameters need to be updated for various reasons. These include the calibration parameters not capturing the effects of the local magnetic field disturbances from the vehicle; actual earth magnetic field changes over time; and differences between the actual earth magnetic field and the earth magnetic field model.

FIG. 1 illustrates a magnetometer calibration system 100 according to one embodiment. The calibration system 100 generally includes an Earth Magnetic Field (EMF) Model module 108, an EMF Model Correction module 110, a North Oriented Local Level (NOLL) to Body Transformation module 114, a Magnetic Compensation module 116, and a Magnetic Calibration Mode module 120. During operation, magnetometer measurements are obtained from at least one magnetometer on an aircraft. The magnetometer measurements are in the body frame of the aircraft and include measurements based on the earth magnetic field and other magnetic disturbances. In addition, attitude, heading angle, and position data are obtained for the aircraft such as from a GPAHRS. The attitude data includes the pitch and roll of the aircraft, while the heading angle data includes the direction of orientation for the aircraft in the local level frame. The position data includes latitude, longitude, and altitude information.

The EMF Model module 108 receives the position data and date information for the aircraft, and the NOLL to Body Transformation module 114 receives the attitude and heading angle data. The EMF Model module 108, which can include a standard earth magnetic field model, computes and outputs earth magnetic field vector data, which can be oriented in the North, East, Down (NED) reference frame. The earth magnetic field model uses the position and date information to look up the value of the earth magnetic field at that position and date in the NED reference frame.

The EMF Model Correction module 110 also receives the position data and date information for the aircraft, and comprises a correction map that includes observed deviations between the earth magnetic field model and the actual earth magnetic field. The EMF Model Correction module 110, which can include an earth magnetic field model correction map, computes and outputs corrections to the earth magnetic field model vector data, which can be oriented in the NED reference frame. The earth magnetic field model correction map uses the position and date information to look up the value of the earth magnetic field corrections at that position and date in the NED reference frame.

The earth magnetic field model vector output from EMF Model module 108 is combined in an adder 112 with the earth magnetic field model correction vector output from EMF Model Correction module 110 to compute a corrected earth magnetic field vector. The corrected earth magnetic field vector is sent to NOLL to Body Transformation module 114 from adder 112. True earth magnetic field data is computed in the aircraft's body frame and output by the NOLL to Body Transformation module 114 based on the corrected earth magnetic field vector, and the attitude and heading angle data.

The Magnetic Calibration Mode module 120 receives the true earth magnetic field data, and the magnetometer measurements of the local magnetic field. In one embodiment, Magnetic Calibration Mode module 120 includes a processing unit 122, such as a calibration Kalman filter, which combines the true earth magnetic field data and the measurements of the local magnetic field. The processing unit 122 calculates compensation coefficients based on the received data, and outputs the compensation coefficients to a memory unit 124 for storage. A Quality Measures module 126 receives calibration parameters from processing unit 122 and outputs a calibration status.

The Magnetic Compensation module 116 receives the measured magnetic field from the magnetometer measurements, and the compensation coefficients from Magnetic Calibration Mode module 120. The Magnetic Compensation module 116 computes and outputs a compensated magnetic field based on the measured magnetic field and the compensation coefficients. The Magnetic Compensation module 116 corrects the measurements of the magnetometer to remove the measured magnetic disturbances so that the compensated magnetometer measurements include only components of the local earth magnetic field, and to allow computing of the magnetic heading angle.

In one embodiment, the calibration Kalman filter is a minimum 12-state Kalman filter that determines twelve coefficients to correct the magnetic measurements. The coefficients can be stored permanently for use in compensation on all future flights. The coefficients can include three for 3-axes of hard iron bias and nine for a 3×3 matrix of soft iron biases, scale factors, and misalignment errors. The twelve states can be part of a larger GPS-inertial Kalman filter or partitioned as a separate twelve-state filter to make it more broadly applicable.

The calibration Kalman filter operates on two input vectors, including magnetic field measurements from the magnetometer in the body frame, and the true earth magnetic field from the earth magnetic field model and earth magnetic field model correction map transformed into the body frame. By comparing these two vectors over an entire flight maneuver, the calibration Kalman filter can determine the coefficients. The calibration Kalman filter only operates during the calibration mode to minimize computation time and to assure the integrity of the aircraft's navigation system. The coefficients are employed during normal operation to compensate the magnetometer measurements so that they can be used in the computation of magnetic heading angle.

In an alternative embodiment, the Kalman filter can be replaced with another processing technique, such as the least squares method, to compute the compensation coefficients.

A pilot can perform a specified flight maneuver to complete the calibration process. The flight maneuver allows the earth magnetic field vector to be rotated around the aircraft's body axis, which provides for three-dimensional calibration.

An exemplary list of conditions includes: altitude greater than about 5000 feet above local terrain; and horizontal magnetic field strength greater than about 180 mgauss. An exemplary list of maneuvers includes: airspeed about 100-350 knots; begin initial calibration maneuver with the aircraft level at 0° heading angle and no vertical speed; begin intermediate calibration maneuver with the aircraft making a standard 360° circular maneuver turning right in 2 minutes; and begin final calibration maneuver with the aircraft making a standard 360° circular maneuver turning left in two minutes.

Figure 2:
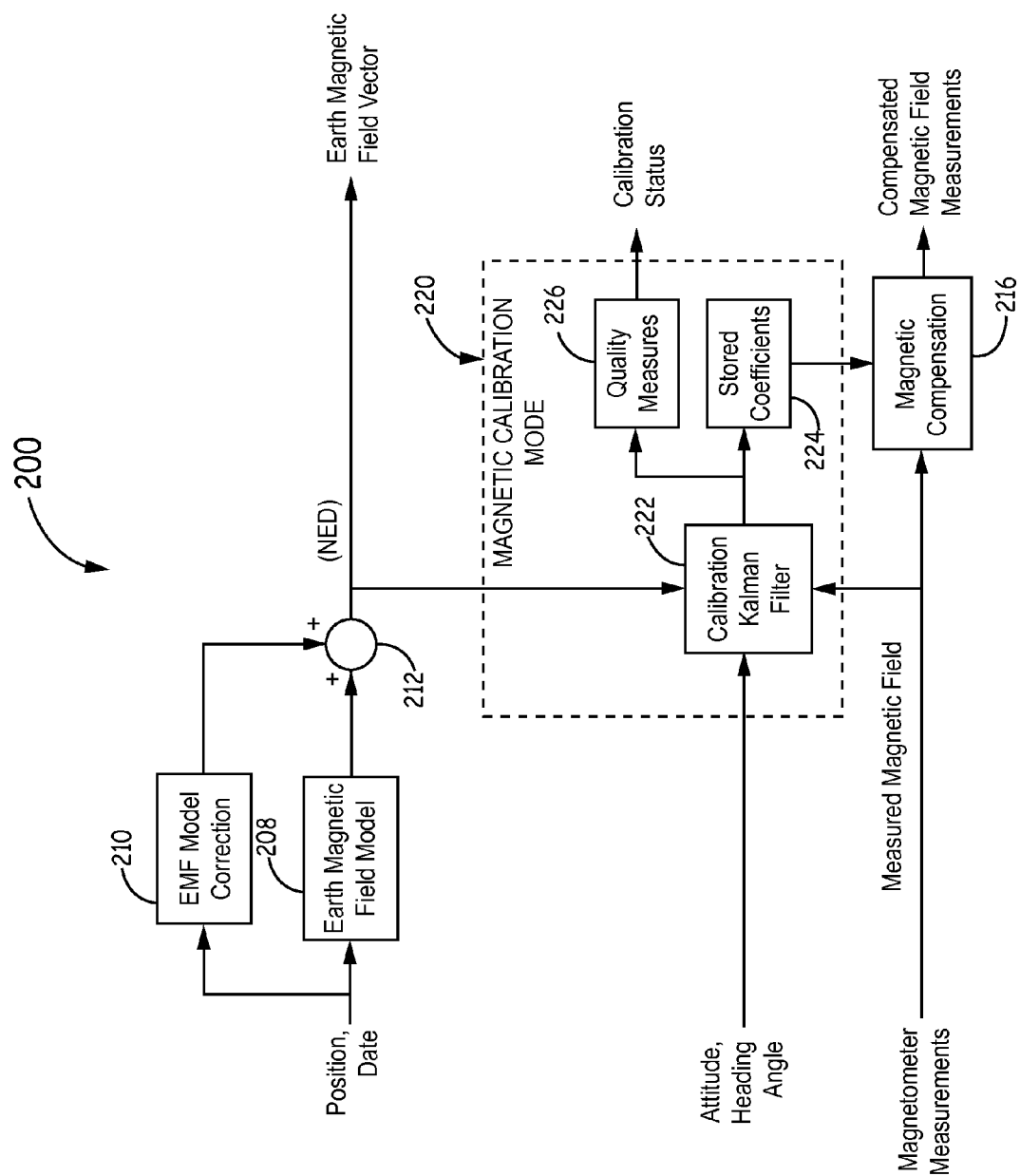
FIG. 2 is a functional block diagram of a magnetometer calibration system according to another embodiment.

FIG. 2 illustrates a magnetometer calibration system 200 according to another embodiment. The calibration system 200 generally includes an EMF Model module 208, an EMF Model Correction module 210, a Magnetic Compensation module 216, and a Magnetic Calibration Mode module 220. The calibration system 200 differs from calibration system 100 of FIG. 1 in that attitude and heading angle data are fed directly to Magnetic Calibration Mode module 220, eliminating the need for a separate coordinate frame transformation module.

The EMF Model module 208 receives the position data and date information for the aircraft. The EMF Model module 208, which can include a standard earth magnetic field model, computes and outputs earth magnetic field vector data, which can be oriented in the NED reference frame. The EMF Model Correction module 210 also receives the position data and date information for the aircraft, and comprises a correction map that includes observed deviations between the earth magnetic field model and the actual earth magnetic field. The EMF Model Correction module 210 computes and outputs corrections to the earth magnetic field model vector data, which can be oriented in the NED reference frame. The earth magnetic field model vector output from EMF Model module 208 is combined in an adder 212 with the earth magnetic field model correction vector output from EMF Model Correction module 210 to compute a corrected earth magnetic field vector.

The attitude and heading angle data, the corrected earth magnetic field vector data, and magnetometer measurements are received by a processing unit 222, such as a calibration Kalman filter, in the Magnetic Calibration Mode module 220. Sending the attitude and heading angle data to the Kalman filter provides for adding "consider states" for attitude, along with coordinate frame transformation, allowing the Kalman filter to take into account attitude error while computing the magnetic compensation terms. The processing unit 222 calculates compensation coefficients based on the received data, and outputs the compensation coefficients to a memory unit 224 for storage. A Quality Measures module 226 receives calibration parameters from processing unit 222 and outputs a calibration status.

A pilot can perform a specified flight maneuver to complete the calibration process. The flight maneuver allows the earth magnetic field vector to be rotated around the aircraft's body axis, which provides for three-dimensional calibration.

During operation of an aircraft, Magnetic Compensation module 216 receives the measured magnetic field from the magnetometer measurements, and the compensation coefficients from Magnetic Calibration Mode module 220. The Magnetic Compensation module 216 computes and outputs a compensated magnetic field based on the measured magnetic field and the compensation coefficients.

A computer or processor used in the present method and system can be implemented using software, firmware, hardware, or any appropriate combination thereof, as known to one of skill in the art. These may be supplemented by, or incorporated in, specially-designed application-specific integrated circuits (ASICs) or field programmable gate arrays (FPGAs). The computer or processor can also include functions with software programs, firmware, or other computer readable instructions for carrying out various process tasks, calculations, and control functions used in the present method and system.

The present methods can be implemented by computer executable instructions, such as program modules or components, which are executed by at least one processor. Generally, program modules include routines, programs, objects, data components, data structures, algorithms, and the like, which perform particular tasks or implement particular abstract data types.

Instructions for carrying out the various process tasks, calculations, and generation of other data used in the operation of the methods described herein can be implemented in software, firmware, or other computer- or processor-readable instructions. These instructions are typically stored on any appropriate computer program product that includes a computer readable medium used for storage of computer readable instructions or data structures. Such a computer readable medium can be any available media that can be accessed by a general purpose or special purpose computer or processor, or any programmable logic device.

Suitable processor-readable media may include storage or memory media such as magnetic or optical media. For example, storage or memory media may include conventional hard disks, compact disks, DVDs, Blu-ray discs, or other optical storage disks; volatile or non-volatile media such as Random Access Memory (RAM); Read Only Memory (ROM), Electrically Erasable Programmable ROM (EEPROM), flash memory, and the like; or any other media that can be used to carry or store desired program code in the form of computer executable instructions or data structures.

EXAMPLE EMBODIMENTS

Example 1 includes a method of magnetic sensor calibration for an aircraft, the method comprising: obtaining attitude data, heading angle data, position data, and date information for the aircraft; inputting the position data and the date information into an earth magnetic field model; inputting the position data and the date information into an earth magnetic field model correction map; inputting the attitude data and the heading angle data into a north oriented local level (NOLL) to body frame transformation module; outputting an earth magnetic field model vector from the earth magnetic field model; outputting an earth magnetic field model correction vector from the earth magnetic field model correction map; compensating the earth magnetic field model vector with the earth magnetic field model correction vector to produce a corrected earth magnetic field model vector; inputting the corrected earth magnetic field model vector into the NOLL to body frame transformation module; inputting magnetic field measurements data into a calibration processing unit; inputting true earth magnetic field data from the NOLL to body frame transformation module into the calibration processing unit; computing compensation coefficients in the calibration processing unit based on the magnetic field measurements data and the true earth magnetic field data; and storing the compensation coefficients in a memory unit.

Example 2 includes the method of Example 1, further comprising sending calibration parameters from the calibration processing unit to a quality measures module; and outputting a calibration status from the quality measures module.

Example 3 includes the method of any of Examples 1-2, further comprising: outputting the stored compensation coefficients to a magnetic sensor compensation module; inputting the magnetic field measurements data into the magnetic sensor compensation module; computing a compensated magnetic field measurement based on the magnetic field measurements data and the compensation coefficients; and outputting the compensated magnetic field measurement.

Example 4 includes the method of any of Examples 1-3, wherein the earth magnetic field correction map provides existing observed differences between the earth magnetic field model and actual earth magnetic field at a given location.

Example 5 includes the method of any of Examples 1-4, wherein the magnetic field measurements data are from at least one magnetometer in the aircraft.

Example 6 includes the method of any of Examples 1-5, wherein the attitude data and the heading angle data are obtained from an attitude and heading reference system in the aircraft.

Example 7 includes the method of any of Examples 1-5, wherein the attitude data, the heading angle data, and the position data are obtained from a global positioning system attitude and heading reference system in the aircraft.

Example 8 includes the method of any of Examples 1-7, wherein the attitude data and the heading data are obtained after one or more in-flight maneuvers by the aircraft.

Example 9 includes the method of any of Examples 1-8, wherein the calibration processing unit includes a Kalman filter that computes the compensation coefficients to correct the magnetic field measurements data.

Example 10 includes the method of any of Examples 1-9, further comprising obtaining inertial measurement data for the aircraft; and inputting the inertial measurement data into the calibration processing unit.

Example 11 includes a system for magnetic calibration of an aircraft, comprising: a calibration processing unit in the aircraft; a memory unit in operative communication with the calibration processing unit; at least one magnetic sensor on the aircraft and in operative communication with the calibration processing unit; an earth magnetic field model configured to receive position and date information for the aircraft and output an earth magnetic field model vector; an earth magnetic field model correction map configured to receive position and date information for the aircraft and output an earth magnetic field model correction vector; an adder configured to combine the earth magnetic field model vector with the earth magnetic field model correction vector to produce a corrected earth magnetic field model vector; a north oriented local level (NOLL) to body frame transformation module configured to receive attitude data and heading angle data for the aircraft, and receive the corrected earth magnetic field model vector; and a magnetic sensor compensation module configured to receive magnetic field measurements data from the magnetic sensor; wherein the calibration processing unit is configured to receive the magnetic field measurements data from the magnetic sensor, receive true earth magnetic field data from the NOLL to body frame transformation module, compute compensation coefficients based on the magnetic field measurements data and the true earth magnetic field data, store the compensation coefficients in the memory unit, and output the stored compensation coefficients to the magnetic sensor compensation module.

Example 12 includes the system of Example 11, further comprising a quality measures module configured to receive calibration parameters from the calibration processing unit and output a calibration status.

Example 13 includes the system of any of Examples 11-12, wherein the magnetic sensor compensation module is configured to compute a compensated magnetic field based on the magnetic field measurements data and the compensation coefficients; and output the compensated magnetic field.

Example 14 includes the system of any of Examples 11-13, wherein the at least one magnetic sensor comprises at least one magnetometer.

Example 15 includes the system of any of Examples 11-14, wherein the attitude data and the heading angle data are from an attitude and heading reference system in the aircraft.

Example 16 includes the system of any of Examples 11-14, wherein the attitude data, the heading angle data, and the position data are from a global positioning system attitude and heading reference system in the aircraft.

Example 17 includes the system of any of Examples 11-16, wherein the calibration processing unit includes a Kalman filter that computes the compensation coefficients.

Example 18 includes a method of magnetic sensor calibration for an aircraft, the method comprising: obtaining attitude data, heading angle data, position data, and date information for the aircraft; inputting the position data and the date information into an earth magnetic field model; inputting the position data and the date information into an earth magnetic field model correction map; outputting an earth magnetic field model vector from the earth magnetic field model; outputting an earth magnetic field model correction vector from the earth magnetic field model correction map; compensating the earth magnetic field model vector with the earth magnetic field model correction vector to produce a corrected earth magnetic field model vector; inputting the attitude data and the heading angle into a calibration processing unit; inputting magnetic field measurements data into the calibration processing unit; inputting the corrected earth magnetic field model vector into the calibration processing unit; computing compensation coefficients in the calibration processing unit based on the magnetic field measurements data and the corrected earth magnetic field model vector; and storing the compensation coefficients in a memory unit.

Example 19 includes the method of Example 18, further comprising: outputting the stored compensation coefficients to a magnetic sensor compensation module; inputting the magnetic field measurements data into the magnetic sensor compensation module; computing a compensated magnetic field measurement based on the magnetic field measurements data and the compensation coefficients; and outputting the compensated magnetic field measurement.

Example 20 includes a computer program product, comprising: a computer readable medium having instructions stored thereon, executable by a processor, to perform a method of magnetic sensor calibration for an aircraft, according to Example 19.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A method of magnetic sensor calibration for an aircraft, the method comprising:
   obtaining attitude data, heading angle data, position data, and date information for the aircraft;
   inputting the position data and the date information into an earth magnetic field model;
   inputting the position data and the date information into an earth magnetic field model correction map;
   inputting the attitude data and the heading angle data into a north oriented local level (NOLL) to body frame transformation module;

outputting an earth magnetic field model vector from the earth magnetic field model;

outputting an earth magnetic field model correction vector from the earth magnetic field model correction map;

compensating the earth magnetic field model vector with the earth magnetic field model correction vector to produce a corrected earth magnetic field model vector;

inputting the corrected earth magnetic field model vector into the NOLL to body frame transformation module;

inputting magnetic field measurements data into a calibration processing unit;

inputting true earth magnetic field data from the NOLL to body frame transformation module into the calibration processing unit;

computing compensation coefficients in the calibration processing unit based on the magnetic field measurements data and the true earth magnetic field data;

storing the compensation coefficients in a memory unit;

outputting the stored compensation coefficients to a magnetic sensor compensation module;

inputting the magnetic field measurements data into the magnetic sensor compensation module;

computing a compensated magnetic field measurement based on the magnetic field measurements data and the compensation coefficients; and outputting the compensated magnetic field measurement.

2. The method of claim 1, further comprising:

sending calibration parameters from the calibration processing unit to a quality measures module; and outputting a calibration status from the quality measures module.

3. The method of claim 1, wherein the earth magnetic field correction map provides existing observed differences between the earth magnetic field model and actual earth magnetic field at a given location.

4. The method of claim 1, wherein the magnetic field measurements data are from at least one magnetometer in the aircraft.

5. The method of claim 3, wherein the attitude data and the heading angle data are obtained from an attitude and heading reference system in the aircraft.

6. The method of claim 3, wherein the attitude data, the heading angle data, and the position data are obtained from a global positioning system attitude and heading reference system in the aircraft.

7. The method of claim 1, wherein the attitude data and the heading data are obtained after one or more in-flight maneuvers by the aircraft.

8. The method of claim 1, wherein the calibration processing unit includes a Kalman filter that computes the compensation coefficients to correct the magnetic field measurements data.

9. The method of claim 1, further comprising:

obtaining inertial measurement data for the aircraft; and inputting the inertial measurement data into the calibration processing unit.

10. The method of claim 7, wherein the one or more in-flight maneuvers induce accelerations in the aircraft that enable a single antenna global positioning system to provide a heading angle.

11. The method of claim 2, wherein the calibration parameters are updated to incorporate fluctuations between the true earth magnetic field data and the earth magnetic field model.

12. The method of claim 1, further comprising determining whether calibration parameters are computable from one or more in-flight maneuvers of the aircraft.

13. The method of claim 2, further comprising determining whether the calibration parameters require an update based on a process comprising:

determining that the calibration parameters are not capturing effects of local magnetic field disturbances from the aircraft;

determining that actual earth magnetic field changes over time; or determining differences between the actual earth magnetic field and the earth magnetic field model.

14. A computer program product, comprising:

a non-transitory computer readable medium having instructions stored thereon, executable by a processor, to perform a method of magnetic sensor calibration for an aircraft, the method comprising:

obtaining attitude data, heading angle data, position data, and date information for the aircraft;

inputting the position data and the date information into an earth magnetic field model;

inputting the position data and the date information into an earth magnetic field model correction map;

inputting the attitude data and the heading angle data into a north oriented local level (NOLL) to body frame transformation module;

outputting an earth magnetic field model vector from the earth magnetic field model;

outputting an earth magnetic field model correction vector from the earth magnetic field model correction map;

compensating the earth magnetic field model vector with the earth magnetic field model correction vector to produce a corrected earth magnetic field model vector;

inputting the corrected earth magnetic field model vector into the NOLL to body frame transformation module;

inputting magnetic field measurements data into a calibration processing unit;

inputting true earth magnetic field data from the NOLL to body frame transformation module into the calibration processing unit;

computing compensation coefficients in the calibration processing unit based on the magnetic field measurements data and the true earth magnetic field data;

storing the compensation coefficients in a memory unit;

outputting the stored compensation coefficients to a magnetic sensor compensation module;

inputting the magnetic field measurements data into the magnetic sensor compensation module;

computing a compensated magnetic field measurement based on the magnetic field measurements data and the compensation coefficients; and outputting the compensated magnetic field measurement.

15. A system for magnetic calibration of an aircraft, comprising:

a calibration processing unit in the aircraft;

a memory unit in operative communication with the calibration processing unit;

at least one magnetic sensor on the aircraft and in operative communication with the calibration processing unit;

an earth magnetic field model configured to receive position and date information for the aircraft and output an earth magnetic field model vector;

an earth magnetic field model correction map configured to receive position and date information for the aircraft and output an earth magnetic field model correction vector;

an adder configured to combine the earth magnetic field model vector with the earth magnetic field model correction vector to produce a corrected earth magnetic field model vector;

a north oriented local level (NOLL) to body frame transformation module configured to receive attitude data and heading angle data for the aircraft, and receive the corrected earth magnetic field model vector; and a magnetic sensor compensation module configured to receive magnetic field measurements data from the magnetic sensor;

wherein the calibration processing unit is configured to:
  receive the magnetic field measurements data from the magnetic sensor;
  receive true earth magnetic field data from the NOLL to body frame transformation module;
  compute compensation coefficients based on the magnetic field measurements data and the true earth magnetic field data;
  store the compensation coefficients in the memory unit; and
  output the stored compensation coefficients to the magnetic sensor compensation module;

wherein the magnetic sensor compensation module is configured to:
  compute a compensated magnetic field based on the magnetic field measurements data and the compensation coefficients; and
  output the compensated magnetic field.

16. The system of claim 15, further comprising a quality measures module configured to receive calibration parameters from the calibration processing unit and output a calibration status.

17. The system of claim 15, wherein the at least one magnetic sensor comprises at least one magnetometer.

18. The system of claim 15, wherein the attitude data and the heading angle data are from an attitude and heading reference system in the aircraft.

19. The system of claim 15, wherein the attitude data, the heading angle data, and the position data are from a global positioning system attitude and heading reference system in the aircraft.

20. The system of claim 15, wherein the calibration processing unit includes a Kalman filter that computes the compensation coefficients.

* * * * *